(12) United States Patent
Teruya et al.

(10) Patent No.: US 7,902,503 B2
(45) Date of Patent: Mar. 8, 2011

(54) SLIT DISK FOR MODIFIED FARADAY CUP DIAGNOSTIC FOR DETERMINING POWER DENSITY OF ELECTRON AND ION BEAMS

(75) Inventors: Alan T. Teruya, Livermore, CA (US); John W. Elmer, Danville, CA (US); Todd A. Palmer, State College, PA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 439 days.

(21) Appl. No.: 12/188,398

(22) Filed: Aug. 8, 2008

(65) Prior Publication Data

US 2010/0032562 A1     Feb. 11, 2010

(51) Int. Cl.
*H01J 47/00* (2006.01)
(52) U.S. Cl. ...... 250/305; 250/306; 250/307; 250/492.1; 250/492.3; 250/493.1; 250/336.1; 250/324; 324/71.1; 324/71.3
(58) Field of Classification Search .................. 250/305, 250/306, 307, 492.1, 492.3, 493.1, 336.1, 250/397; 324/71.1, 71.3
See application file for complete search history.

(56) References Cited

U.S. PATENT DOCUMENTS

| | | | | |
|---|---|---|---|---|
| 6,300,755 | B1* | 10/2001 | Elmer et al. | 324/71.3 |
| 7,288,772 | B2* | 10/2007 | Elmer et al. | 250/397 |
| 7,378,830 | B2* | 5/2008 | Teruya et al. | 324/71.3 |

* cited by examiner

*Primary Examiner* — Robert Kim
*Assistant Examiner* — Michael Maskell
(74) *Attorney, Agent, or Firm* — Eddie E. Scott; James S. Tak

(57) ABSTRACT

A diagnostic system for characterization of an electron beam or an ion beam includes an electrical conducting disk of refractory material having a circumference, a center, and a Faraday cup assembly positioned to receive the electron beam or ion beam. At least one slit in the disk provides diagnostic characterization of the electron beam or ion beam. The at least one slit is located between the circumference and the center of the disk and includes a radial portion that is in radial alignment with the center and a portion that deviates from radial alignment with the center. The electron beam or ion beam is directed onto the disk and translated to the at least one slit wherein the electron beam or ion beam enters the at least one slit for providing diagnostic characterization of the electron beam or ion beam.

20 Claims, 4 Drawing Sheets

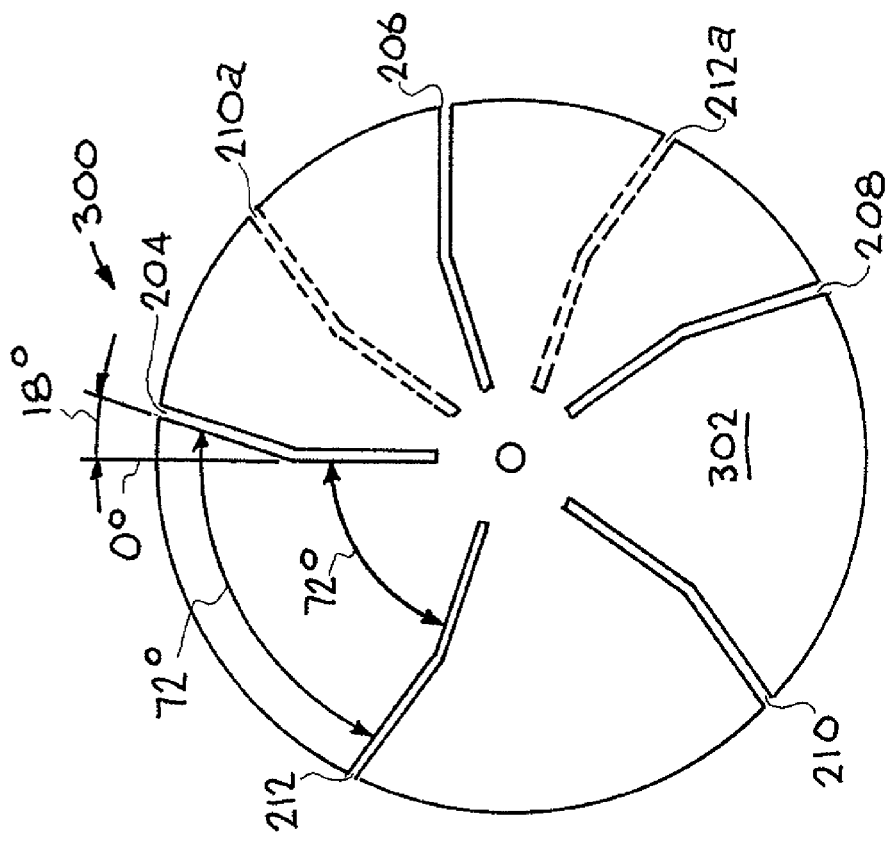
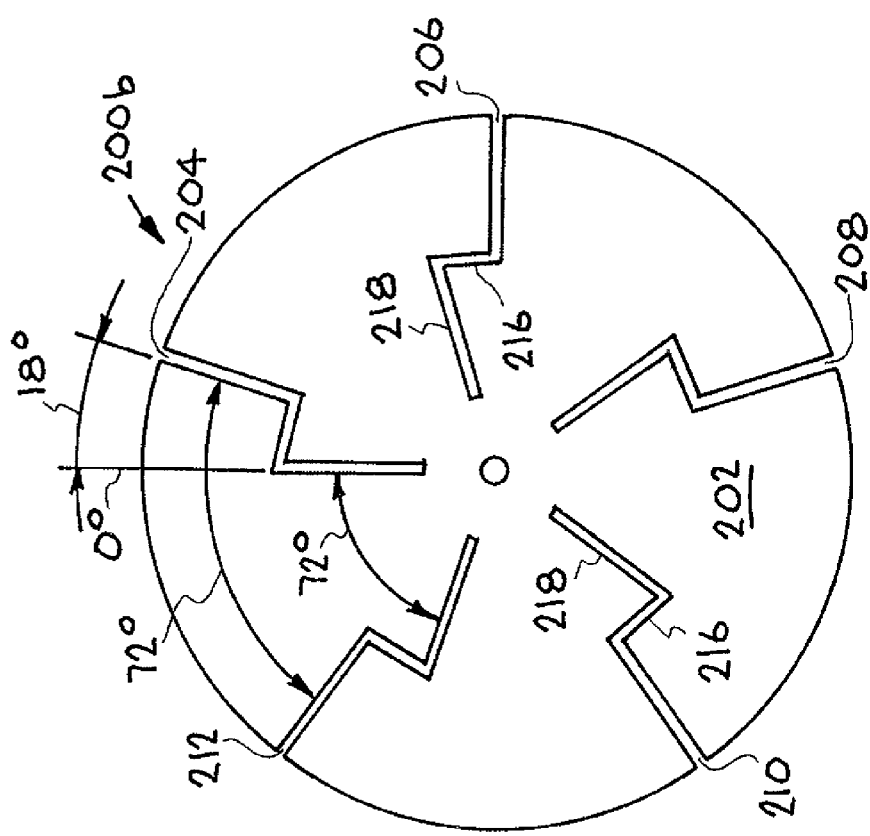
FIG. 3
FIG. 2B

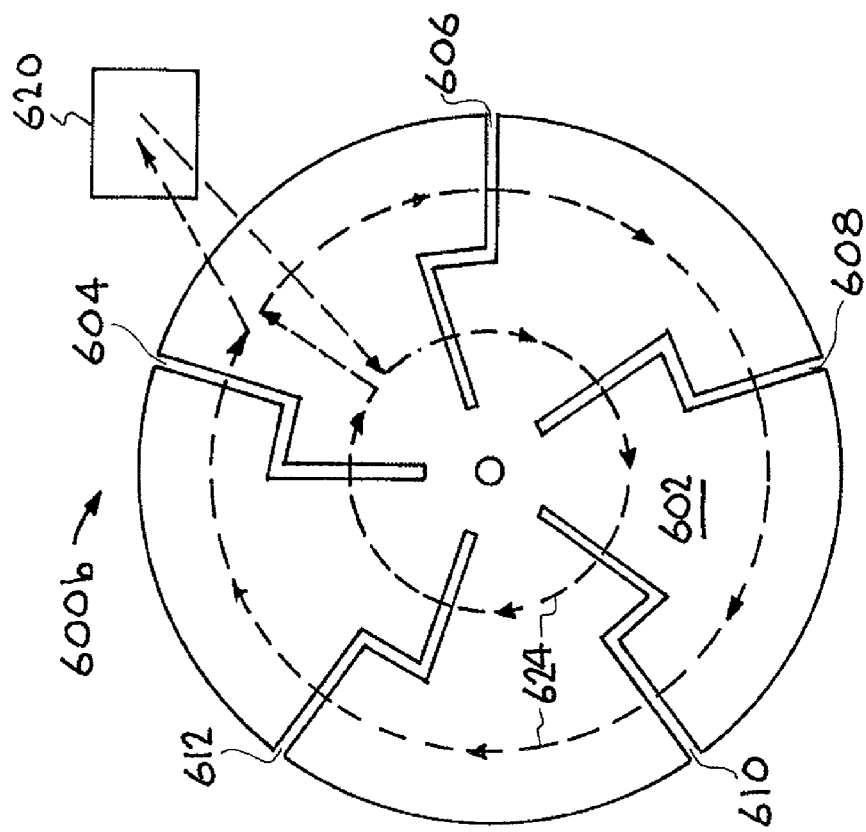
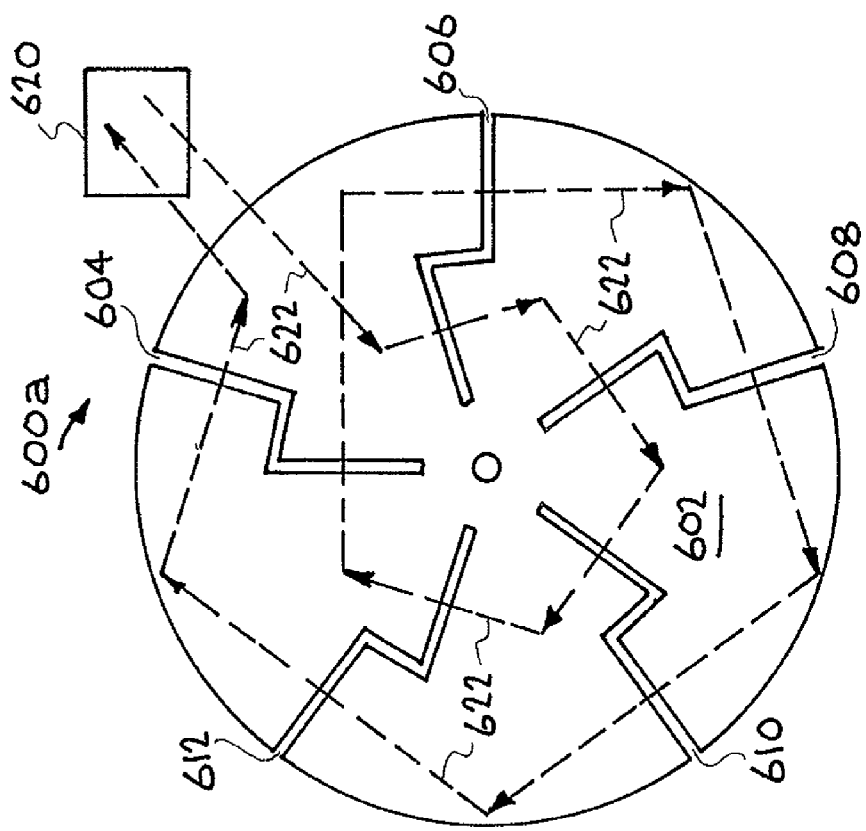
FIG. 6A
FIG. 6B

SLIT DISK FOR MODIFIED FARADAY CUP DIAGNOSTIC FOR DETERMINING POWER DENSITY OF ELECTRON AND ION BEAMS

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

1. Field of Endeavor

The present invention relates to electron and ion beams and more particularly to a slit disk for modified faraday cup diagnostic for determining power density of electron and ion beams.

2. State of Technology

Electron beams are considered to be the most precise and clean method available for welding thick sections of materials. Unfortunately, electron beams suffer one critical deficiency, namely the repeatability of focusing the beam to a known power density. Without the ability to reliably reproduce the power distribution in an electron beam, weld quality cannot be guaranteed. This problem is exacerbated by the fact the many welds are made over a period of time and with different welding operators. Further complications arise when welds are developed on one machine than transferred to a different machine for production. An electron beam diagnostic method has been developed that enables the precise characterization of the power density distribution in high power electron beams. Such diagnostic method, which utilizes a modified Faraday cup, is exemplified by U.S. Pat. No. 5,382,895; U.S. Pat. No. 5,468,966; U.S. Pat. No. 5,554,926, U.S. Pat. No. 5,583,427; U.S. Pat. No. 6,300,755; and U.S. Pat. No. 7,288,772. This electron beam diagnostic method has been utilized, for example, to certify changes in electron beam welders, and is further described in J. W. Elmer et al, "Tomographic Imaging of Non-Circular and Irregular Electron Beam Power Density Distributions," Welding Journal 72 (ii), p. 493-s, 1993.

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides an improved tungsten disk with radial slits for use in an enhanced modified Faraday cup (EMFC) system to determine the power density distribution of an electron or ion beam. A beam diagnostic device has already been developed that can be used to measure the beam properties while it is being scanned in a circle over a tungsten disk with radial slits. A time history of the portions of the beam passing through the slits provides beam profile data that is used in conjunction with data acquisition software and computed tomography software to reconstruct the beam power distribution and important beam distribution parameters. The accuracy of the shape of the reconstruction is dependent on the number of beam profiles, with more slits providing higher resolution. In the current embodiment of the tungsten slit disk, the slits extend radially with the number of equally-spaced angles dependent upon the expected size of the beam and the diameter of the circular deflection. The present invention increases the number of slit angles available on the tungsten disk by using slits with sections with different angles and thus improves the resolution of the beam reconstruction.

One embodiment of the present invention provides a diagnostic apparatus for characterization of electron and ion beams. The apparatus includes an electrical conducting disk of refractory material, the disk having a circumference, a center in the disk, and a Faraday cup assembly located below the disk and positioned to receive the electron and ion beams for providing diagnostic characterization of the electron and ion beams. The at least one slit is located between the circumference and the center of the disk. The at least one slit has a first radial portion that is in radial alignment with the center. The at least one slit has a second portion that deviates from radial alignment with the center.

Another embodiment of the present invention provides a diagnostic method of characterizing an electron or ion beam. The method includes the steps of providing an electrical conducting disk of refractory material having a circumference and a center with at least one slit in the disk for providing diagnostic characterization of the electron or ion beam. The at least one slit is located between the circumference and the center of the disk. The at least one slit has a first radial portion that is in radial alignment with the center. The at least one slit has a second portion that deviates from radial alignment with the center. A Faraday cup assembly is located below the disk and positioned to receive the electron or ion beam. The electron or ion beam is directed onto the disk. The electron or ion beam is translated to the at least one slit wherein the electron or ion beam enters the at least one slit for providing diagnostic characterizing of the electron or ion beam.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

FIGS. 2A and 2B illustrate embodiments of the present invention.

FIG. 3 illustrates how symmetry about the center of the tungsten disk with the "bent slit" design allows a beam profile taken by a slit on one side of the disk to be used as if it had been taken on the opposite side of the disk.

FIG. 6A is an example of one method the tungsten disk with the "crooked slit" design may be used.

FIG. 6B shows an alternate method of using the tungsten disk with the "crooked slit" design.

DETAILED DESCRIPTION OF THE INVENTION

Figure 2A:
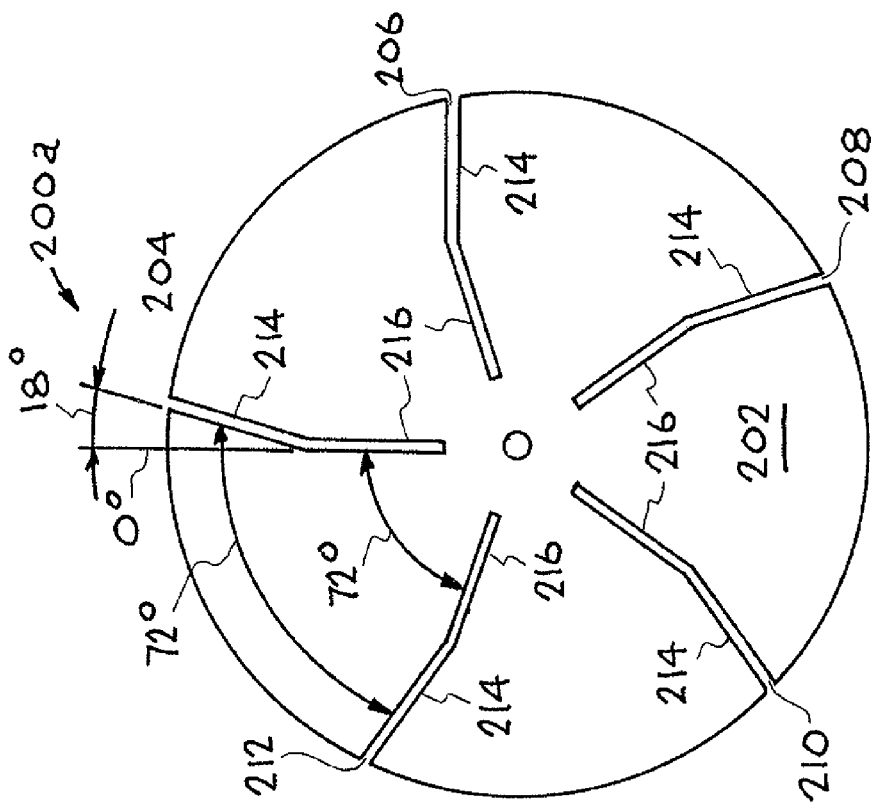

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

The present invention provides a system utilizing an enhanced modified Faraday cup (EMFC) for the examination of the power distribution within an electron beam. The EMFC is used to acquire spatial profiles of the beam at a number of equally spaced angles. The most common use of this process by Applicants is in electron beam welding machines and involves deflecting the beam in a circle around a tungsten disk with radial slits illustrated in FIG. 1 of the drawings.

Figure 1:
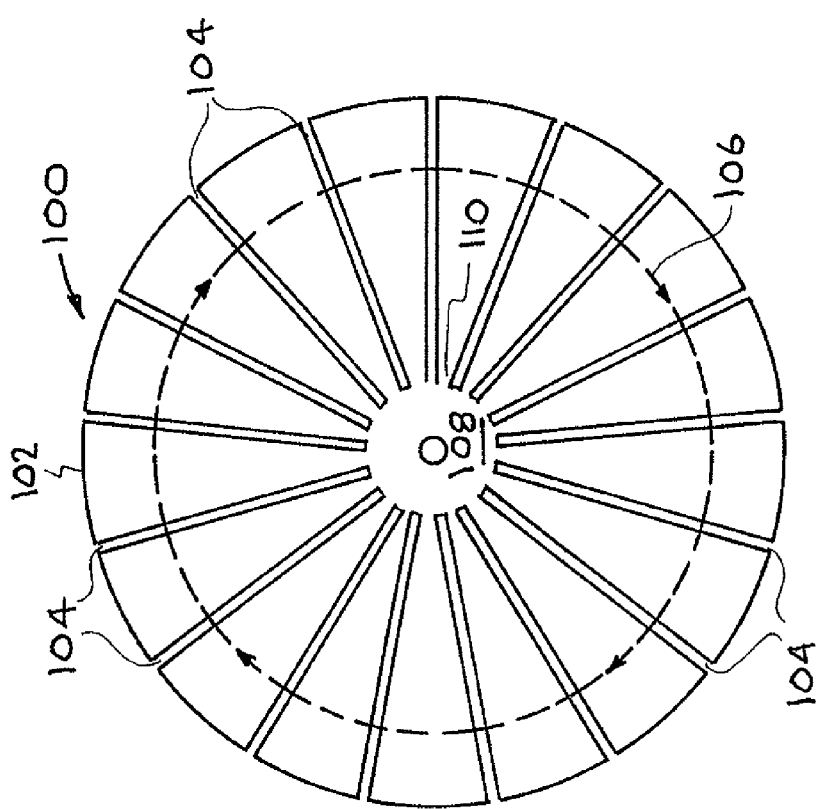
FIG. 1 shows a tungsten slit disk of the type currently used in Applicants' Modified Faraday Cup electron beam profiler.

FIG. 1 illustrates a tungsten slit disk 102 of the type currently used in Applicants' Modified Faraday Cup electron beam profiler. FIG. 1 is labeled "Prior Art." Applicants' Modified Faraday Cup electron beam profiler is designated generally by the reference numeral 100. Applicants' electron beam profiler 100 includes a disk 102 contains an odd number of equally spaced radial slits 104 of known width much smaller than the size of the electron beam to be analyzed.

The electron beam of Applicants' electron beam profiler 100 is deflected around the disk 102 in a circular path 106 at a known rate and diameter. As the beam passes tangentially across each slit a portion of the beam travels through the slit and is captured in the Faraday cup beneath. The data acquisition system reads a time record of the beam current captured by the Faraday cup and uses the known deflection of the beam to calculate the profile of the beam taken at an angle perpendicular to the angle of the slit. The odd number of profiles allows each profile to be taken at a unique angle as the profiles taken at angles 180° from each other would be redundant if one of the profiles is reversed by the tomography software.

One of the limitations of the disk 102 shown in FIG. 1 is that as the slits 104 near the center 108 of the disk 102, the amount of tungsten metal 110 between the slits 104 becomes relatively small. This produces a weak point where a section of the brittle tungsten could break off, rendering the disk 102 useless.

The accuracy of tomographic reconstructions is improved by increasing the number of profile angles. Therefore it was desired to provide a disk that can increase the number of profile angles without increasing the number of slits.

The current of the portion of the beam passing through each slit into the EMFC is measured by a data acquisition device recording a time record of the voltage across a current viewing resistor. This time record in conjunction with the known speed of the scan across the slit provides a spatial profile of the beam at an angle perpendicular to the slit. A set of profiles is used to determine the power distribution in the beam using computed tomography techniques. The number of radial slits in the tungsten disk determines the number of profiles in a set of data. The largest possible number of profiles is desired in order to give the most accurate reconstruction of the beam.

While a large number of slits are desired, the number of slits is constrained by several factors. First of all, portions of the beam traversing through any of the slits are captured by a single Faraday cup underneath the tungsten slit disk. Thus if the beam is wide enough, portions of it can traverse through two adjacent slits simultaneously, resulting in an overlap of the beam profiles in the time record. The computed tomography algorithm cannot do a reconstruction without a clear separation between the profiles, thus the number of slits (and thus the angular separation of them) is selected taking into account the expected size of the beam and the diameter of the circular deflection around the slit disk. A second constraint is the diameter of circular deflection by a particular piece of equipment. A larger diameter will allow more slits for a given expected beam size. However, a number of equipment-specific factors such as working distance from the electron beam gun and deflection coil design limit the maximum deflection circle diameter, thus limiting the number of slits. A third constraint is the manufacturability and durability of the slit disk. The slits are made using wire-cut electrical discharge machining. As the radial slits are cut inward towards the center the distance between adjacent slits gets smaller. Since tungsten is a brittle material, the disk may crack if the slits are too close together and/or any additional forces are put on the disk.

It is possible to increase the number of profiles using a device to slightly rotate the MFC to a known angle after a set of profiles has been taken. If the angle of rotation is carefully chosen between one or more additional sets of data, then all of the sets of profiles may be combined to do a reconstruction with a greater number of profiles. However, this method requires a precision rotation stage inside the vacuum chamber along with additional control electronics. Some electron beam equipment may not have this capability readily available, so a method of increasing the number of profiles without additional hardware is desired.

The present invention increases the number of profiles available from a slit disk by replacing the straight radial slits with slits containing multiple angles. The angle of the beam profile will be dependent upon the distance from the center of the disk. During operation, the use of precision deflection of the beam will be required in order to ensure that the beam path across a slit is always perpendicular to that slit. The straight portion of the slit at a given angle is designed to be long enough to capture the entire beam as it travels across it. Precision control of the beam is possible using numerical controllers such as those typically found in modern electron beam welding equipment.

While the most common anticipated use for the present invention will be in electron beam welding equipment, it will be applicable in any process where a charged particle beam (electron or ion) is measured using the EMFC and computed tomography method such as in a miniature MFC for micro electron beams.

Referring now to FIG. 2A an example slit disk with five slits with one bend each is illustrated. It is to be understood that this description may be extended to any odd number of slits. In the current practice, at least 17 straight radial slits are used in a slit disk as illustrated in FIG. 1. The inner portion of each slit extends radially from the center of the disk. In this embodiment of the new design, the slit is bent at a point approximately halfway from the inner edge of the slit to the outer edge of the disk. The slit is bent at an angle equal to ¼ of the angle between slits. In the case of FIG. 2A the angle between slits is 72° (360°/5 slits) so the angle of the bend is 18°.

FIG. 2A shows a first embodiment of an improved slit disk system showing a "bent slit" design. The improved slit disk system is designated generally by the reference numeral 200a. For the purposes of this figure the tungsten disk 202 is shown with only five slits (204, 206, 208, 210, and 212 with an angular spacing between them of 72°. However this technique may be extended to any greater odd number of slits that may be manufactured. The "bent slit" provides two angles at which the beam can be scanned compared to the one angle of a straight slit. The angular spacing between slits is determined by dividing 360° by the number of slits. In this case 360° divided by 5 slits provides an angular spacing of 72°. The bent sections 214 of the slits deviate from the radial portions 216 of the slits by ¼ of this angular spacing (18° in this case), thus providing a second set of slits with the same 72° relative to each other but offset 18° from the first set.

Referring now to FIG. 2B a second embodiment of an improved slit disk showing a "crooked slit" design. This improved slit disk system is designated generally by the reference numeral 200b. FIG. 2B shows a second way of providing multiple angles with a single slit. In this embodiment of the new design, the inner and outer portions of the slit are both positioned radially while being connected by a small transverse section. The outer angle differs from the inner angle by 18° for the same reasons given above for the "bent" configuration.

For the purposes of this figure the tungsten disk 202 is shown with only five slits (204, 206, 208, 210, and 212 with an angular spacing between them of 72°, however this technique works for any odd number of slits that may be manufactured. As in the "bent slit" design, the "crooked slit" design also provides two angles at which the beam can be scanned compared to the one angle of a straight slit, however the main difference is that in this case both the inner and outer sets of slits are radial. In this case the inner radial slits 218 comprise one set of slits with angular spacing of 72°, and the outer radial slits 216 comprise the second set of slits with the same 72° angular spacing, but with an offset of 18° (72°÷4) from the first set.

The reason for the angle of the bend being of the angle between slits is to insure the beam profile taken by each slit is unique. FIG. 3 shows how five bent slits provide ten angles for acquiring beam profile data. It is customary in computed tomography to use profiles with angles $0° \leq \theta < 180°$ since profiles at angles $180° \leq \theta < 360°$ are considered redundant mirror images of profiles in the former range of angles. In the case of the tungsten disks, slits are evenly spaced around the entire disk, but data from slits with angles $180° \leq \theta < 360°$ are reversed and used at an angle 0-180° (rotated 180°). In this example, the five slits are spaced 72° (⅕ of 360°) apart, and the outer portion of the slits are offset 18° (¼ of 72°) from the inner portions. Slit 1 provides profiles at 0° and 18°, the reflection of Slit 4 provides profiles at 36° and 54°, Slit 2 provides profiles at 72° and 90°, etc. Thus, five slits can provide profiles at ten angles versus only five with a conventional straight slit design.

Referring again to FIG. 3 how symmetry about the center of the tungsten disk with the "bent slit" design 302 allows a beam profile taken by a slit on one side of the disk to be used as if it had been taken on the opposite side of the disk is illustrated. In this figure the virtual slits on the right side of the disk 210a and 212a are 180° rotations of actual slits 210 and 212 on the left side of the disk. As described in the prior art, the beam profile acquired as the beam passes over the actual slit can be manipulated in software to be equivalent to the profile that would have been acquired by the virtual slit. The angle between adjacent actual and virtual slits (e.g. 204 and 210a) is 36°. Thus it is possible to acquire profiles of the beam with this disk at 10 angles spaced at 18° increments, whereas straight slits would only allow five angles at 36° increments.

While this embodiment addresses the case of only two angles in a slit, more angles are possible as long as each straight section of the slit is long enough to capture the whole width of the beam as the beam is swept across it. The angles of each section will need to vary by (360°/n)/(2 m) where n=the number of slits and m=the number of sections. A five slit disk with three sections on each slit will need to have angles within each section vary by (360°/5)/(2*3))=72°/6=12°. Thus, Slit 1 would provide profiles at 0°, 12° and 24°, the 180° rotation of Slit 4 would provide profiles at 36°, 48° and 60°, etc.

Figure 4:
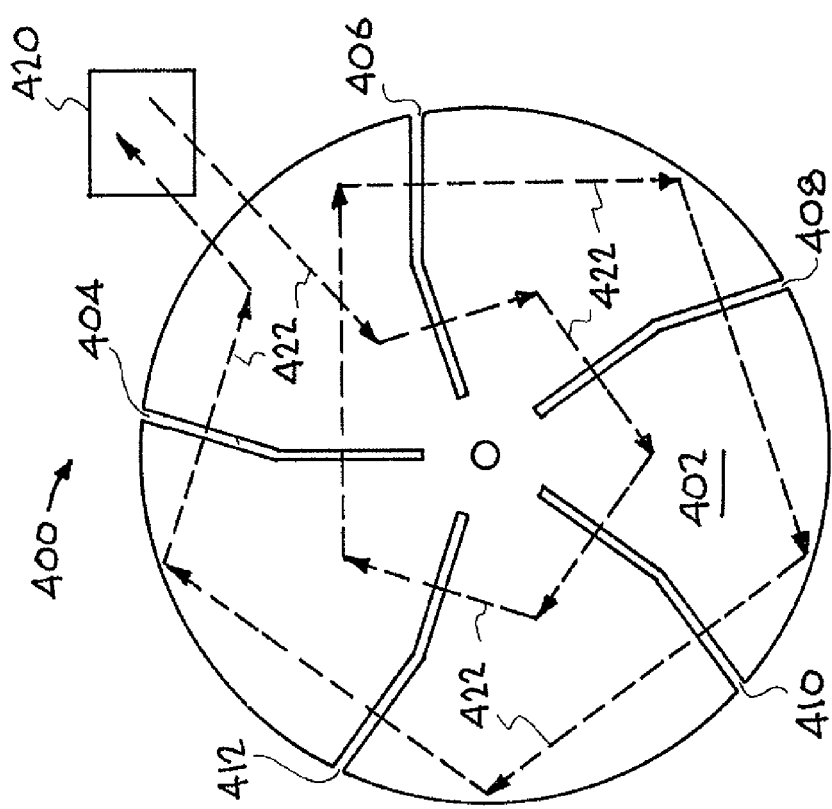
FIG. 4 is an example of one method the tungsten disk with the "bent slit" design may be used.

The numerical control of the beam in modern electron beam equipment allows the beam to be steered precisely around the tungsten slit disk. A set of waypoints would be programmed into the equipment's numerical controller along with the desired speed of travel between waypoints. The beam would travel from waypoint to waypoint under numerical control. FIG. 4 shows one possible path a beam may take around the disk to acquire profiles at each of the angles. Here the beam is turned on while being aimed at a beam block consisting of a grounded refractory metal physically and electrically isolated from the MFC assembly. Once the beam is at full power it can be steered around the path between waypoints, represented by the dotted line, traversing each slit once and ending up back on the beam block where it can be turned off. Because the beam traverses each slit only once, the data acquisition system may be triggered by the signal of the first beam profile, possibly eliminating the need for additional indexing or triggering techniques. An additional benefit of this method is that the heat deposited onto the tungsten slit disk (and by conduction the rest of the MFC assembly) is minimized.

Referring now to FIG. 4, an example of one method the tungsten disk with the "bent slit" design 402 may be used is illustrated. In this example the electron beam is turned on while pointed at a beam block 420 positioned off of the disk. This prevents excessive heating of the tungsten disk or the MFC. The beam is then deflected around the disk in a set path 422 using the numerical controls of the equipment providing the beam. The beam is deflected tangentially across each slit and then returns to the beam block 420 where it may be powered down. Because the numerical controls have deflected the beam around the set path with known speeds across each slit, the tomography software can put the beam profiles into the proper order and reconstruct the beam power distribution.

Figure 5:
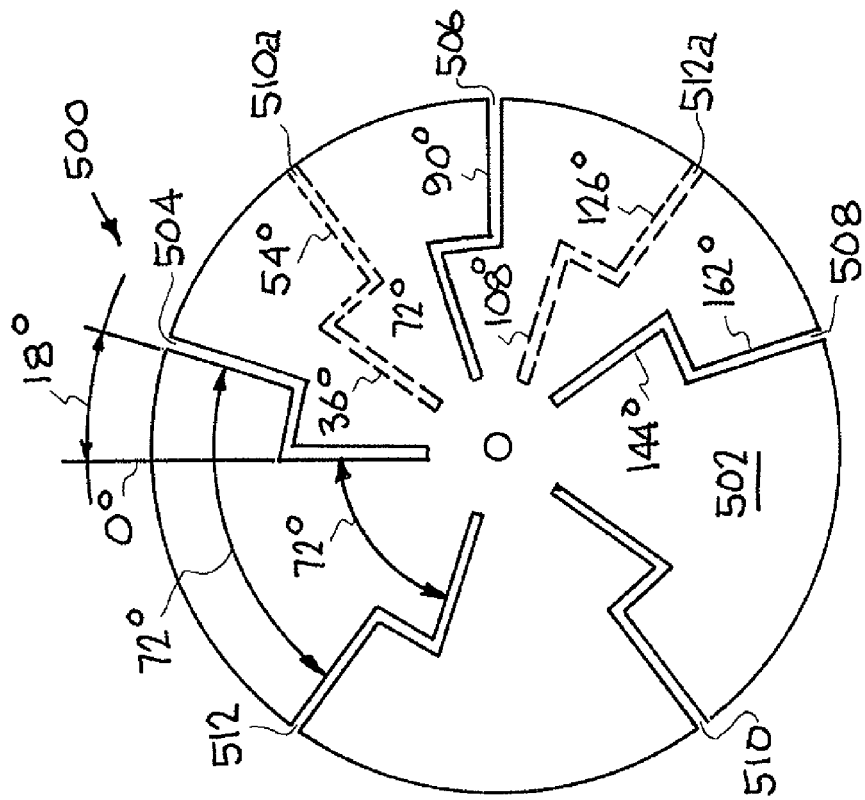
FIG. 5 illustrates how symmetry about the center of the tungsten disk with the "crooked slit" design allows a beam profile taken by a slit on one side of the disk to be used as if it had been taken on the opposite side of the disk.

FIG. 5 shows how a five slit disk in this "crooked" configuration will provide the same ten angles between 0° and 180°. FIG. 5 illustrates how symmetry about the center of the tungsten disk with the "crooked slit" design 502 allows a beam profile taken by a slit on one side of the disk to be used as if it had been taken on the opposite side of the disk. In this figure the virtual slits on the right side of the disk 510a and 512a are 180° rotations of actual slits 510 and 512 on the left side of the disk. As described in the prior art, the beam profile acquired as the beam passes over the actual slit can be manipulated in software to be equivalent to the profile that would have been acquired by the virtual slit. The angle between adjacent actual and virtual slits (e.g. 504 and 510a) is 36°. Thus it is possible to acquire profiles of the beam with this disk at 10 angles spaced at 18° increments, whereas straight slits would only allow five angles at 36° increments.

FIG. 6 shows how a beam can be steered around the disk to acquire the data. The path in FIG. 6A uses waypoints programmed into a numerical controller and is similar to the path used in the bent configuration in FIG. 4. FIG. 6B takes advantage of the radial orientation of all of the slits and uses circular paths around the inner and outer slits in the same manner that circular beam deflection paths are used to take data with straight radial slits. While the crooked configuration may be more difficult to fabricate than the bent configuration, there may also be some advantages in simplification of the control of the beam. The crooked configuration can also be used in equipment where numerical controls are not available by simply acquiring beam profiles by running a circular deflection (produced by analog function generators) over the inner and outer sets of slits and combining the two sets of data.

FIG. 6A is an example of one method the tungsten disk with the "crooked slit" design 602 may be used. In this example the electron beam is turned on while pointed at a beam block 620 positioned off of the disk. This prevents excessive heating of the tungsten disk or the MFC. The beam is then deflected around the disk in a set path 622 using the numerical controls of the equipment providing the beam. The beam is deflected perpendicularly across each slit and then returns to the beam block 620 where it may be powered down. Because the numerical controls have deflected the beam around the set path with known speeds across each slit, the tomography software can put the beam profiles into the proper order and reconstruct the beam power distribution.

FIG. 6B shows an alternate method of using the tungsten disk with the "crooked slit" design 602. In this method the beam starts on the beam block 620, is deflected in a circle across the inner radial sections of the slits 604, 606, 608, 610 and 612 and then in a circle across the outer radial sections of the slits. The beam is then returned to the beam block 620 where it may be powered down. The radial nature of both the inner and outer sections allows a circular path to cross each slit tangentially when acquiring the beam profile. Again the tomography software uses known information about the beam deflection to reorder the beam profiles and reconstruct the beam power distribution.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A diagnostic apparatus for characterization of an electron beam or an ion beam, comprising:
    an electrical conducting disk of refractory material, said disk having a circumference and a center; and
    at least one slit in said disk for providing diagnostic characterization of the electron beam or ion beam;
    said at least one slit located between said circumference and said center,
    said at least one slit having a first radial portion that is in radial alignment with said center, and
    said at least one slit having a second portion that deviates from radial alignment with said center.

2. The diagnostic apparatus for characterization of electron beam or ion beam of claim 1 wherein said second portion that deviates from radial alignment with said center is a bent portion that deviates from radial alignment with said center.

3. The diagnostic apparatus for characterization of electron beam or ion beam of claim 2 wherein said bent portion is bent at a point substantially halfway from said center to said circumference.

4. The diagnostic apparatus for characterization of electron beam or ion beam of claim 2 wherein said disk has a number of slits with an angle between said slits and wherein said angle is determined by dividing 360° by said number of slits.

5. The diagnostic apparatus for characterization of electron beam or ion beam of claim 2 wherein said disk has a number of slits with an angle between said slits and wherein said bent portion is bent at an angle equal to one fourth said angle between said slits.

6. The diagnostic apparatus for characterization of electron beam or ion beam of claim 2 wherein said disk has a number of slits that provide a number of sections between said number of slits and wherein said bent portion has a bent portion angle and wherein said bent portion angle is determined the formula $(360°/n)/(2\ m)$ where n=said number of slits and m=said number of sections.

7. The diagnostic apparatus for characterization of electron beam or ion beam of claim 1 including a beam block for receiving the electron beam or an ion beam.

8. The diagnostic apparatus for characterization of electron beam or ion beam of claim 1 wherein said second portion that deviates from radial alignment with said center is a crooked portion that deviates from radial alignment with said center.

9. The diagnostic apparatus for characterization of electron beam or ion beam of claim 8 including a third portion that is in radial alignment with said center and wherein said crooked portion connects said first portion and said third portion.

10. The diagnostic apparatus for characterization of electron beam or ion beam of claim 1 wherein said disk has a number of slits with an angle between said slits and wherein said angle is determined by dividing 360° by said number of slits.

11. The diagnostic apparatus for characterization of electron beam or ion beam of claim 8 including a beam block for receiving the electron beam or an ion beam.

12. A diagnostic apparatus for characterization of an electron beam or an ion beam utilizing a Faraday cup assembly, comprising:
    an electrical conducting disk of refractory material, said disk having a circumference and a center; and
    at least one slit in said disk for providing diagnostic characterization of the electron beam or ion beam, wherein the electron beam or ion beam is directed through said at least one slit in said disk to the Faraday cup assembly;
    said at least one slit located between said circumference and said center,
    said at least one slit having a first radial portion that is in radial alignment with said center, and
    said at least one slit having a second portion that deviates from radial alignment with said center.

13. The diagnostic apparatus for characterization of electron beam or ion beam of claim 12 including a beam block for receiving the electron beam or an ion beam.

14. The diagnostic apparatus for characterization of electron beam or ion beam of claim 12 wherein said disk has a number of slits with an angle between said slits and wherein said angle is determined by dividing 360° by said number of slits.

15. The diagnostic apparatus for characterization of electron beam or ion beam of claim 12 wherein said disk has a number of slits with an angle between said slits and wherein said bent portion is bent at an angle equal to one fourth said angle between said slits.

16. The diagnostic apparatus for characterization of electron beam or ion beam of claim 12 wherein said disk has a number of slits that provide a number of sections between said number of slits and wherein said bent portion has a bent portion angle and wherein said bent portion angle is determined the formula $(360°/n)/(2m)$ where n=said number of slits and m=said number of sections.

17. A diagnostic method of characterizing an electron beam or an ion beam, comprising the steps of:
providing an electrical conducting disk of refractory material having a circumference and a center with at least one slit in said disk for providing diagnostic characterization of the electron beam or ion beam, said at least one slit located between said circumference and said center of said disk, said at least one slit having a first radial portion that is in radial alignment with said center, and said at least one slit having a second portion that deviates from radial alignment with said center;
providing a Faraday cup assembly located below said disk and positioned to receive the electron beam or ion beam; and
directing the electron beam or ion beam onto said disk and translating the electron or ion beam to said at least one slit wherein portions of the electron beam or ion beam enters said at least one slit and is received by said Faraday cup assembly for providing diagnostic characterizing of the electron beam or ion beam.

18. The diagnostic method of characterizing an electron beam or an ion beam of claim 17 wherein said step of providing an electrical conducting disk of refractory material includes providing a number of slits in said disk with an angle between said slits and wherein said angle is determined by dividing 360° by said number of slits.

19. The diagnostic method of characterizing an electron beam or an ion beam of claim 17 wherein said step of providing an electrical conducting disk of refractory material having a circumference and a center with at least one slit in said disk for providing diagnostic characterization of the electron beam or ion beam, said at least one slit located between said circumference and said center of said disk, said at least one slit having a first radial portion that is in radial alignment with said center, and said at least one slit having a second portion that deviates from radial alignment with said center includes providing a bent portion that deviates from radial alignment with said center and wherein said bent portion is bent at a point substantially halfway from said center to said circumference.

20. A diagnostic method of characterizing an electron beam or an ion beam utilizing a Faraday cup assembly, comprising the steps of:
providing an electrical conducting disk of refractory material having a circumference and a center with at least one slit in said disk for providing diagnostic characterization of the electron beam or ion beam, said at least one slit located between said circumference and said center of said disk, said at least one slit having a first radial portion that is in radial alignment with said center, and said at least one slit having a second portion that deviates from radial alignment with said center; and
directing the electron beam or ion beam onto said disk and translating the electron or ion beam to said at least one slit wherein portions of the electron beam or ion beam enters said at least one slit and is received by the Faraday cup assembly for providing diagnostic characterizing of the electron beam or ion beam.

* * * * *